United States Patent [19]

Froitzheim

[11] 4,412,131
[45] Oct. 25, 1983

[54] MONOCHROMATOR FOR CHARGED PARTICLES
[75] Inventor: Hermann Froitzheim, Aachen, Fed. Rep. of Germany
[73] Assignee: Leybold Heraeus GmbH, Cologne, Fed. Rep. of Germany
[21] Appl. No.: 249,246
[22] Filed: Mar. 30, 1981
[30] Foreign Application Priority Data
Apr. 17, 1980 [DE] Fed. Rep. of Germany ....... 3014785
[51] Int. Cl.$^3$ ............................................. H01J 49/48
[52] U.S. Cl. ..................................... 250/305; 250/294
[58] Field of Search ............... 250/305, 310, 294, 296, 250/297

[56] References Cited
U.S. PATENT DOCUMENTS
3,233,099  2/1966  Berry et al.
3,805,068  4/1974  Lee ..................................... 250/305

FOREIGN PATENT DOCUMENTS
1296830  6/1969  Fed. Rep. of Germany.
2056163  5/1971  France.

OTHER PUBLICATIONS
Vinogradova et al., "Increasing the Intensity of a Single-Mass Ion Beam in Mass-Monochromators by Means of a Decelerating System", Translated from *Pribory i Tekhnika Eksperimenta*, No. 2, Mar.-Apr., 1974, pp. 39-40.
Hinterberger, "Symmetrized Double-Monochromator Systems", *Nuclear Instruments and Methods*, 119 (1974), pp. 43-49.
Kuyatt et al., "Field Emission Deflection Energy Analyzer", *The Review of Scientific Instruments*, vol. 43, No. 1, 1972, pp. 108-111.

Primary Examiner—Alfred E. Smith
Assistant Examiner—Jack I. Berman
Attorney, Agent, or Firm—Felfe & Lynch

[57] ABSTRACT

A monochromator for charged particles comprises a premonochromator and a main monochromator is tandem with a retarding lens disposed therebetween. The arrangement is suitable for electron energy loss spectrometry due to the high achievable intensities.

5 Claims, 1 Drawing Figure

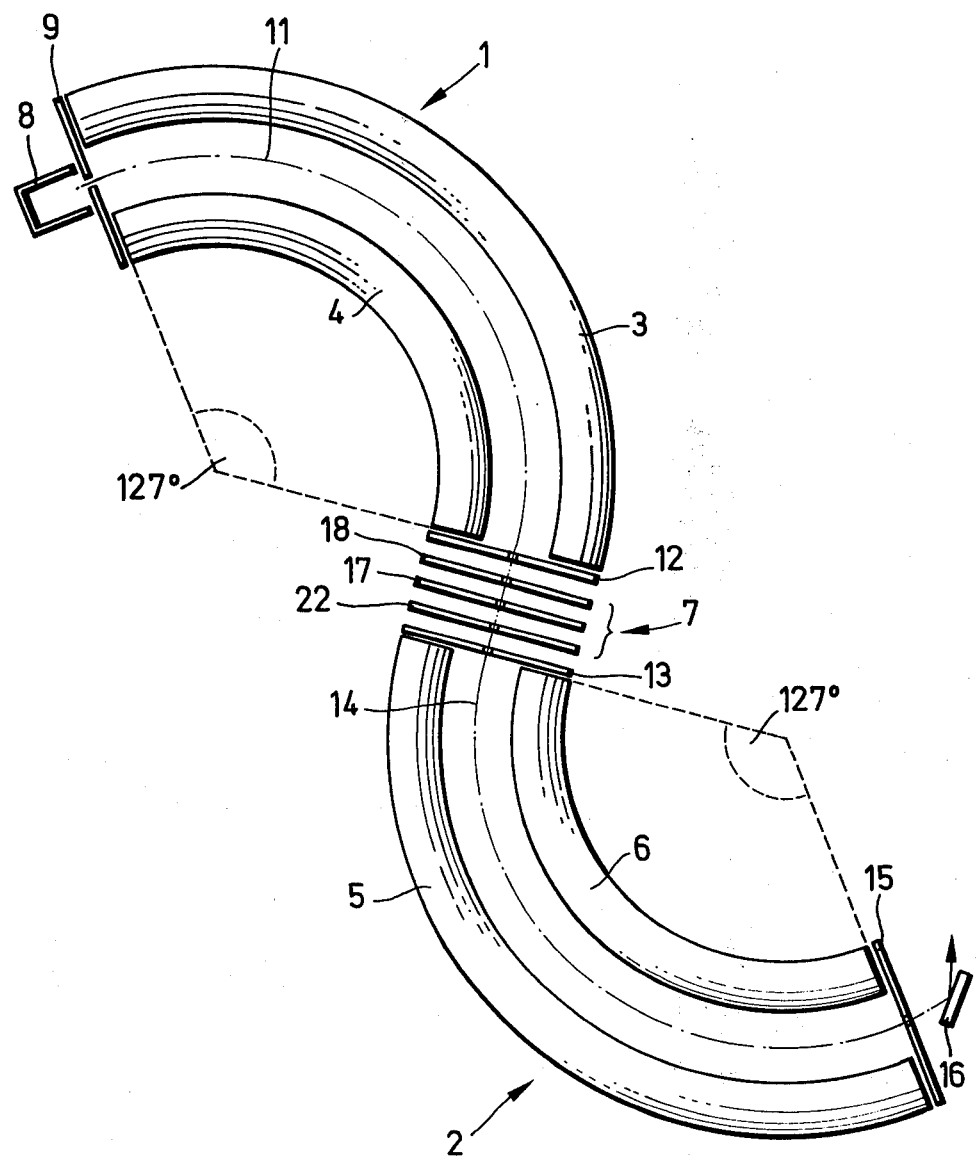

MONOCHROMATOR FOR CHARGED PARTICLES

BACKGROUND OF THE INVENTION

For the high-resolution spectrometry of charged particles it is desirable to produce highly monochromatic beams of charged particles, i.e., streams containing particles of precisely equal energy, insofar as possible. For this purpose dispersion elements on an electrostatic basis are being used, using mainly sphere or cylinder condensers. Cylinder condensers consist of two concentric cylinder segment surfaces; sphere condensers have two concentric sphere segment surfaces. As a rule, the surfaces extend over an angle of 127°.

Basically, it is true in all these apparatus that the relative resolution $\Delta E/E_o$ is a constant which depends on the special geometry. It follows from this that $E_o$ is to be kept as small as possible in order to achieve a high absolute resolution. Then, however, the intensity that is achievable is limited by the space charge.

SUMMARY OF THE INVENTION

It is the object of the present invention to create a monochromator for charged particles, which can be operated at higher intensities than heretofore without loss of resolution.

In accordance with the invention, this problem is solved by disposing two monochromators in tandem and situating a retarding lens between the two monochromators. In a double monochromator constructed in this manner, the possibility exists of operating the first monochromator at higher energy and hence higher intensity.

On the basis of a computation it can be concluded that the output current density of a single monochromator has the following value:

$$j_{ae} = \Delta E_o \cdot E_o^{3/2} \cdot C$$

In this equation, $j_{ae}$ represents the output current density of the single monochromator, $E_o$ represents the energy of the particles, $\Delta E_o$ represents the width at half maximum intensity.

C represents a constant.

For the output current density of a double monochromator consisting, for example, of two condensers, with the retardation of the particles between the two monochromators in accordance with the invention, the following applies:

$$j_{ad} \geq \Delta E_o \cdot E_1^{1/2} \cdot E_o \cdot C$$

wherein:

$j_{ad}$ represents the output current density of the double monochromator, $E_o$ represents the energy of the particles in the second condenser, and $E_1$ represents the energy of the particles emerging from the first condenser.

A comparison of the two intensities $j_{ad}$ and $j_{ae}$ shows the following:

$$\frac{j_{ad}}{j_{ae}} \geq \frac{\Delta E_o \cdot E_1^{1/2} \cdot E_o}{\Delta E_o \cdot E_o^{3/2}} = \sqrt{\frac{E_1}{E_o}}$$

From this it can be seen that, by the use of a double monochromator and the production between the monochromators of a retardation of the particles with regard to intensity, the factor $\sqrt{E_1/E_o}$ can be obtained. This factor is greater than 1 since $E_1$ is greater than $E_o$.

BRIEF DESCRIPTION OF THE DRAWING

Advantages and details of the invention will be explained with the aid of an embodiment of a double monochromator represented diagrammatically in the FIGURE.

DETAILED DESCRIPTION OF THE INVENTION

The double monochromator represented in the FIGURE consists of the cylinder condensers 1 and 2 whose cylinder segment surfaces are designated as 3 and 4 and as 5 and 6, respectively. In the embodiment represented, the cylinder condenser 1 is the premonochromator which is operated at elevated energy. Between the premonochromator 1 and the cylinder condenser 2 which is disposed in a mirror-image relationship thereto and forms the main monochromator, there is disposed the retarding lens generally indicated at 7.

The particles produced in the particle source 8, which is indicated only diagrammatically, pass through the entry slit 9 into the premonochromator 1 whose axis is indicated at 11. They leave the premonochromator through the slit 12 with the energy $E_1$. In the retarding lens 7 they are retarded to the energy $E_o$ and pass through the entry slit 13 into the main monochromator 2 whose axis is indicated at 14. From the main monochromator the particles thus highly monochromated pass through the slit 15 and strike the sample 16. The apparatus that follow, such as apparatus for measuring the energy loss which the particles undergo in their collision with the surface of the sample, are not shown.

In the embodiment represented, the retarding lens 7 consists of three slitted masks 17, 18 and 22. The slits in the masks are parallel to the cylinder segment surfaces in the manner customary in cylinder condensers. The voltages applied thereto are selected such that the desired retardations are achieved.

The described double monochromator is suitable, for example, for the production of highly monochromated electrons. Accordingly, electrons are produced in the particle source 8 which leave the premonochromator 1 with the energy $E_1$ (e.g., 10 volts). In the retarding lens 7 they are retarded to the energy $E_o$ (e.g., 0.4 volts). In the monochromator 2, an additional monochromation is performed, so that the particles leave the main monochromator with a resolution of, for example, 10 meV. The achievable intensities amount to approximately $5 \times 10^{-10}$ amperes. Formerly, at an energy of 0.4 eV, the maximum intensity that could be achieved amounted to less than $10^{-11}$ amperes. Current values can vary by a factor of 20.

What is claimed is:

1. A monochromator for charged particles, comprising: two monochromators in tandem and a retarding lens disposed between the two monochromators.

2. The monochromator of claim 1, wherein the two monochromators comprise a premonochromator comprising a cylinder condenser and a main monochromator comprising a cylinder condenser and between which the retarding lens is disposed.

3. The monochromator of claim 1 or 2, wherein the retarding lens comprises three slit masks.

4. A monochromator for electron energy loss spectrometry according to claim 2, wherein the premonochromator effects an energy level of 10 V emerging electrons and the retarding lens retards the electrons to 0.4 V.

5. A method of producing a high-intensity, low-energy, highly-monochromatic electron beam, comprising:

providing a high-energy, high-intensity electron beam;

passing the electron beam through a first monochromator, whereby the high-energy of the electron beam allows efficient monochromation;

passing the electron beam from the first monochromator through means for retarding the high energy of the electron beam, whereby a low-energy, high-intensity electron beam is produced; and passing the retarded electron beam through a second monochromator, whereby monochromation of the retarded electron beam is produced.

* * * * *